United States Patent
Chang et al.

(10) Patent No.: US 9,325,299 B2
(45) Date of Patent: Apr. 26, 2016

(54) DETECTING METHOD AND DEVICE FOR SUPPRESSING INTERFERENCE OF LOW-FREQUENCY NOISE

(71) Applicant: EGALAX_EMPIA TECHNOLOGY INC., Taipei (TW)

(72) Inventors: Chin-Fu Chang, Taipei (TW); Shang-Tai Yeh, Taipei (TW); Guang-Huei Lin, Taipei (TW); Po-Chuan Lin, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 618 days.

(21) Appl. No.: 13/889,702

(22) Filed: May 8, 2013

(65) Prior Publication Data

US 2013/0314144 A1    Nov. 28, 2013

Related U.S. Application Data

(60) Provisional application No. 61/643,951, filed on May 8, 2012.

(51) Int. Cl.
| | |
|---|---|
| *H03K 3/013* | (2006.01) |
| *H04B 1/10* | (2006.01) |
| *G06F 3/044* | (2006.01) |
| *G11C 27/02* | (2006.01) |
| *G06F 3/041* | (2006.01) |
| *G06F 3/0354* | (2013.01) |

(52) U.S. Cl.
CPC ............ *H03K 3/013* (2013.01); *G06F 3/03545* (2013.01); *G06F 3/044* (2013.01); *G06F 3/0418* (2013.01); *G11C 27/026* (2013.01)

(58) Field of Classification Search
CPC ... G06F 3/03545; G06F 3/0418; G06F 3/044; G11C 27/026; H03K 3/013; H04B 1/10
USPC .................................. 327/355, 361, 517, 551
See application file for complete search history.

(56) References Cited

U.S. PATENT DOCUMENTS

| | | | |
|---|---|---|---|
| 6,546,057 B1 * | 4/2003 | Yeap ........................ | H04B 1/10 375/285 |
| 2008/0158169 A1 * | 7/2008 | O'Connor ............. | G06F 3/0418 345/173 |

\* cited by examiner

*Primary Examiner* — William Hernandez
(74) *Attorney, Agent, or Firm* — WPAT, P.C.; Justin King

(57) ABSTRACT

The invention, upon receiving an input signal, sums the absolute values of the difference of each pair of values adjacent to each other within a series of detected signal values to suppress the interference of low-frequency noise. Furthermore, the invention sums the absolute values of the moving averages of the differences of each pair of values adjacent to each other within a series of detected signal values to suppress both the interference of low-frequency noise and the interference of high-frequency noise. No synchronization with the input signal is necessary. The detection can be started at any phase of the input signal.

21 Claims, 5 Drawing Sheets

DETECTING METHOD AND DEVICE FOR SUPPRESSING INTERFERENCE OF LOW-FREQUENCY NOISE

CROSS REFERENCE TO RELATED PATENT APPLICATION

This patent application claims the domestic priority of the U.S. provisional application 61/643,951 filed on May 8, 2012, and hereby incorporated by reference.

BACKGROUND OF THE INVENTION

1. Field of the Invention

The present invention relates to a signal detecting method and device, and more particularly, to a detecting method and device for suppressing interference of low-frequency noise.

2. Description of the Prior Art

Signals that are under the influence of low-frequency noise may become distorted. These signals may, for example, be used as the driving signals of a capacitive touch sensor. The capacitive touch sensor may include a plurality of detecting electrodes. If a driving signal is provided to one or more of the detecting electrodes, the detecting electrodes themselves will produce self-capacitive coupling or mutual-capacitive coupling between one another. When an external conductive object approaches or touches the capacitive touch sensor, changes in the capacitive coupling may be created in some of the detecting electrodes. By detecting this change in capacitive coupling, the location of the external conductive object can be determined.

When using an active capacitive pen, the activation time of the capacitive pen and the activation time of the touch sensor may not be the same, so one must be synchronized to the other, including synchronization of their frequencies. As a result, additional cost and time are required for the synchronization of signals. In addition, due to the synchronization requirement of the capacitive pen, it can only be used with specific touch sensors, and cannot be widely applied.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

As mentioned before, low-frequency noise may easily affect the received signals. The invention, upon receiving an input signal, sums the absolute values of the difference values of each pair of values adjacent to each other within a series of detected signal values to suppress the interference of low-frequency noise. Furthermore, the invention sums the absolute values of the moving averages of the differences of each pair of values adjacent to each other within a series of detected signal values to suppress both the interference of low-frequency noise and the interference of high-frequency noise. In addition, no synchronization with the input signal is necessary. The detection can be started at any phase of the input signal.

The above and other objectives of the present invention can be achieved by the following technical scheme. A detecting method for suppressing interference of low-frequency noise in accordance with the present invention may include: receiving an input signal; starting to generate a plurality of continuous signal values based on an arbitrary or random phase of the received input signal; generating a plurality of continuous difference values based on the signal values, wherein each difference value is the difference between two adjacent signal values; generating a plurality of continuous absolute values based on the difference values, wherein each absolute value is the absolute value of a difference value; and summing all of the absolute values to produce a complete detecting signal value.

The above and other objectives of the present invention can also be achieved by the following technical scheme. A detecting method for suppressing interference of low-frequency noise in accordance with the present invention may include: receiving an input signal; starting to generate a plurality of continuous signal values based on an arbitrary or random phase of the received input signal; generating a plurality of continuous difference values based on the signal values, wherein each difference value is the difference between two adjacent signal values; generating a plurality of continuous moving averages based on the difference values, wherein each moving average is an average of a distinct set of continuous difference values, and the sets of continuous difference values on which two adjacent moving averages are respectively based differ by at least one difference value; generating a plurality of continuous absolute values based on the moving averages, wherein each absolute value is the absolute value of a moving average; and summing all of the absolute values to produce a complete detecting signal value.

The above and other objectives of the present invention can further be achieved by the following technical scheme. A detecting device for suppressing interference of low-frequency noise in accordance with the present invention may include: a receiving circuit for receiving an input signal; an analog-to-digital converter for starting to generate a plurality of continuous signal values based on an arbitrary or random phase of the received input signal; and a controller including: a means for generating a plurality of continuous difference values based on the signal values, wherein each difference value is the difference between two adjacent signal values; a means for generating a plurality of continuous moving averages based on the difference values, wherein each moving average is an average of a distinct set of continuous difference values, and the sets of continuous difference values on which two adjacent moving averages are respectively based differ by at least one difference value; a means for generating a plurality of continuous absolute values based on the moving averages, wherein each absolute value is the absolute value of a moving average; and a means for summing all of the absolute values to produce a complete detecting signal value.

The above and other objectives of the present invention can further be achieved by the following technical scheme. A detecting device for suppressing interference of low-frequency noise in accordance with the present invention may include: a receiving circuit for receiving an input signal; an analog-to-digital converter for starting to generate a plurality of continuous signal values based on an arbitrary or random phase of the received input signal; and a controller including: a means for generating a plurality of continuous difference values based on the signal values, wherein each difference value is the difference between two adjacent signal values; a means for generating a plurality of continuous absolute values based on the difference values, wherein each absolute value is the absolute value of a difference value; and a means for summing the absolute values to produce a complete detecting signal value.

With the above technical scheme, the present invention includes at least the following advantages and beneficial effects:

1. Signal detection can be performed without synchronization with the input signal;

2. The interference of the low-frequency noise is suppressed by summing the absolute values of the difference values between adjacent signals in a plurality of detected signals; and 3. The interferences of both the low-frequency and the high-frequency noise are suppressed by summing the absolute values of the moving averages of the difference values between adjacent signals in a plurality of detected signals.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1A:
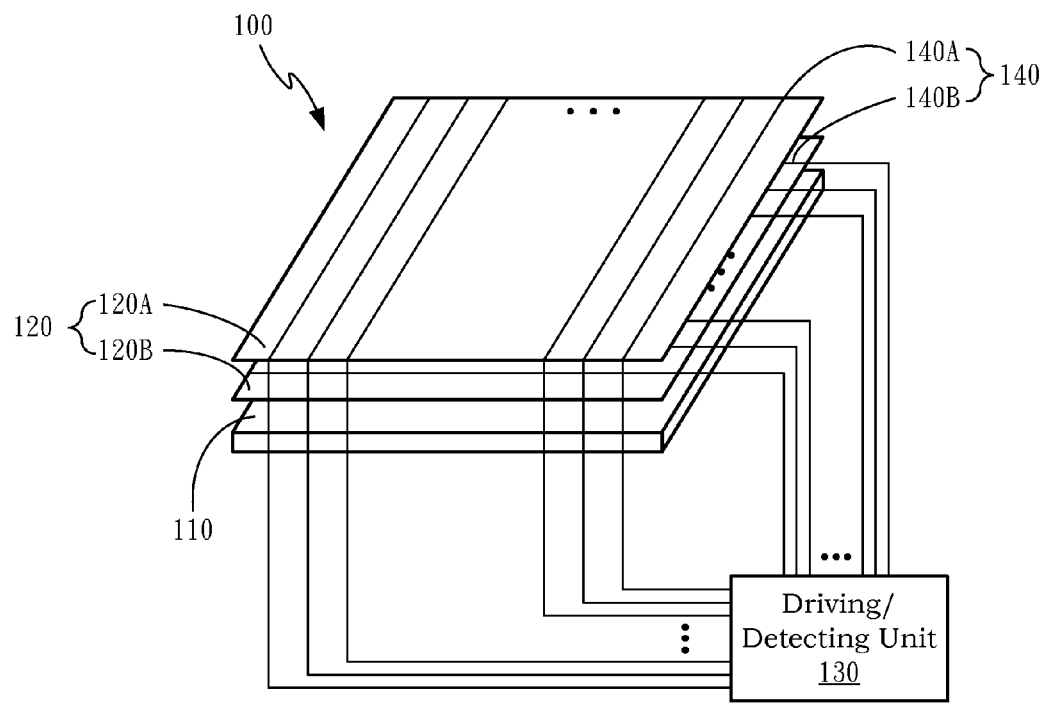
FIGS. 1A and 1B are schematic diagrams illustrating a mutual capacitive sensor.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Referring to FIG. 1A, a position detecting device 100 applicable to the present invention is shown, which includes a sensing device 120 and a driving/detecting unit 130. The sensing device 120 has a sensing layer. In an example of the present invention, the sensing layer can include a first sensing layer 120A and a second sensing layer 120B. The first and second sensing layers 120A and 120B each has a plurality of conductive strips 140, wherein the first conductive strips 140A of the first sensing layer 120A and the second conductive strips 140B of the second sensing layer 120B cross each other. In another example of the present invention, the first and second conductive strips 140A and 140B are disposed on a co-planar sensing layer. The driving/detecting unit 130 produces sensing information based on signals of the conductive strips 140. In the case of self-capacitive detection, for example, conductive strips 140 that are being driven are detected. In the case of mutual-capacitive detection, some of the conductive strips 140 that are not being directly driven by the driving/detecting unit 130 are detected. In addition, the sensing device 120 can be disposed on a display 110. An optional rear shielding layer (not shown) can be interposed between the sensing device 120 and the display 110. In a preferred example of the present invention, there is no rear shielding layer between the sensing device 120 and the display 110 so as to reduce the thickness of the sensing device 120.

The first and second conductive strips can be a plurality of column conductive strips and row conductive strips arranged in columns and rows; a plurality of first dimensional conductive strips and second dimensional conductive strips arranged in first and second dimensions; or a plurality of first axial conductive strips and second axial conductive strips arranged in first and second axes. In addition, the first and second conductive strips can be arranged in orthogonal or non-orthogonal directions. For example, in a polar coordinate system, one of the first and second conductive strips can be arranged in radial direction, and the other one of the first and second conductive strips can be arranged in circular direction. Furthermore, one of the first and second conductive strips can be driving conductive strips, while the other one of the first and second conductive strips can be detecting conductive strips. Said "first dimension" and "second dimension", "first axis" and "second axis", "driving" and "detecting", "driven" or "detected" conductive strips can be used to mean said "first and "second" conductive strips, including but not limited to, being arranged in orthogonal grids, and in any other geometric configurations comprising first dimensional and second dimensional intersecting conductive strips.

Figure 1B:
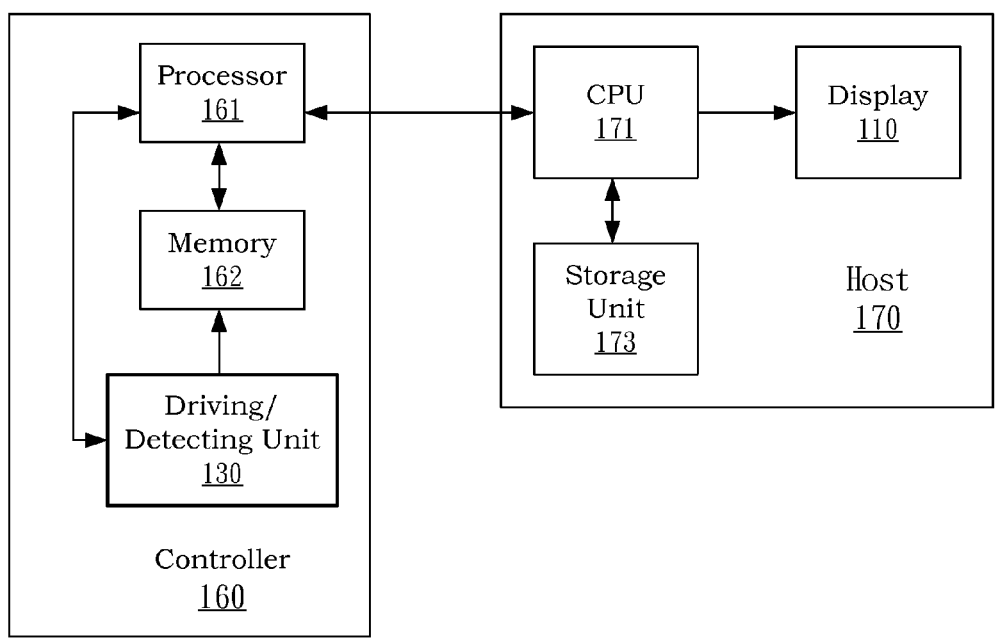

The position detecting device 100 of the present invention can be applied to a computing system as shown in FIG. 1B, which includes a controller 160 and a host 170. The controller includes the driving/detecting unit 130 to operatively couple the sensing device 120 (not shown). In addition, the controller 160 can include a processor 161 for controlling the driving/detecting unit 130 in generating the sensing information. The sensing information can be stored in a memory 162 and accessible by the processor 161. Moreover, the host 170 constitutes the main body of the computing system, and mainly includes a central processing unit 171, a storage unit 173 that can be accessed by the central processing unit 171, and the display 110 for displaying results of operations.

In another example of the present invention, there is a transmission interface between the controller 160 and the host 170. The controlling unit transmits data to the host via the transmission interface. One with ordinary skill in the art can appreciate that the transmission interface may include, but not limited to, UART, USB, I2C, Bluetooth, Wi-Fi, IR and other wireless or wired transmission interfaces. In an example of the present invention, data transmitted can be positions (e.g. coordinates), identified results (e.g. gesture codes), commands, sensing information or other information provided by the controller 160.

In an example of the present invention, the sensing information can be initial sensing information generated under the control of the processor 161, and this information is passed onto the host 170 for position analysis, such as position analysis, gesture determination, command identification, and so on. In another example of the present invention, the sensing information can be analyzed by processor 161 first before forwarding the determined positions, gestures, commands, or the like to the host 170. The present invention does not limit to this example, and one with ordinary skill in the art can readily recognize other interactions between the controller 160 and the host 170.

At each intersection of the conductive strips, the upper and lower conductive strips form the positive and negative electrodes. Each intersection can be regarded as one pixel in an image. When one or more external conductive objects approach or touch the sensing device, said image can be regarded as a photographed touch image (e.g. the pattern of a finger upon touching the sensing device).

When a driven conductive strip is being provided with a driving signal, the driven conductive strip itself produces self capacitance, and produces mutual capacitance on each intersection of the driven conductive strip. Said self-capacitive detection is detecting the self-capacitance of all the conductive strips, which is particularly useful in determining approach or touch of a single external conductive object.

In said mutual-capacitive detection, when a driven conductive strip is being provided with a driving signal, capacitances or changes in capacitances of all intersections on the driven conductive strip are detected with all sensed conductive strips arranged in different dimensions to the driven conductive strip, and are regarded as a row of pixels. Accordingly, all the rows of pixels are combined to form said image. When one or more external conductive objects approach or touch the sensing device, said image can be regarded as a photographed touch image, which is particularly useful in determining approaches or touches of a plurality of external conductive objects.

These conductive strips (the first and second conductive strips) can be made of transparent or opaque materials, such as transparent Indium Tin Oxide (ITO). In terms of the structure, it can be categorized into a Single ITO (SITO) structure and a Double ITO (DITO) structure. One with ordinary skill in the art can appreciate that other materials can be used as the conductive strips, such as carbon nanotube, and they will not be further described.

In an example of the present invention, the horizontal direction is regarded as the first direction, while the vertical direction is regarded as the second direction. Thus, the horizontal conductive strips are the first conductive strips, and the vertical conductive strips are the second conductive strips. However, one with ordinary skill in the art can appreciate that the above is merely an example of the present invention, and the present invention is not limited to this. For example, the vertical direction can be regarded as the first direction, while the horizontal direction can be regarded as the second direction.

During 2D mutual capacitive detection, alternating driving signals are sequentially provided to each first conductive strip, and 1D sensing information corresponding to each driven first conductive strip is obtained from the signals of the second conductive strips. Sensing information of all the first conductive strips are combined together to form 2D sensing information. 1D sensing information can be generated based on the signal of a second conductive strip, or based on the difference between the signal of a conductive strip and a reference value. In addition, the sensing information can be generated based on current, voltage, level of capacitive coupling, amount of charge or other electrical characteristics, and can be in analog or digital form.

When there is no external object actually approaching or covering the touch sensor, or when the system has not determined any external object actually approaching or covering the touch sensor, the position detecting device may generate a reference value based on the signals of the second conductive strips. This reference value represents stray capacitance on the touch sensor. Sensing information can be generated based on the signal of a second conductive strip or the result of subtracting the reference value from the signal of the second conductive strip.

Figure 2:
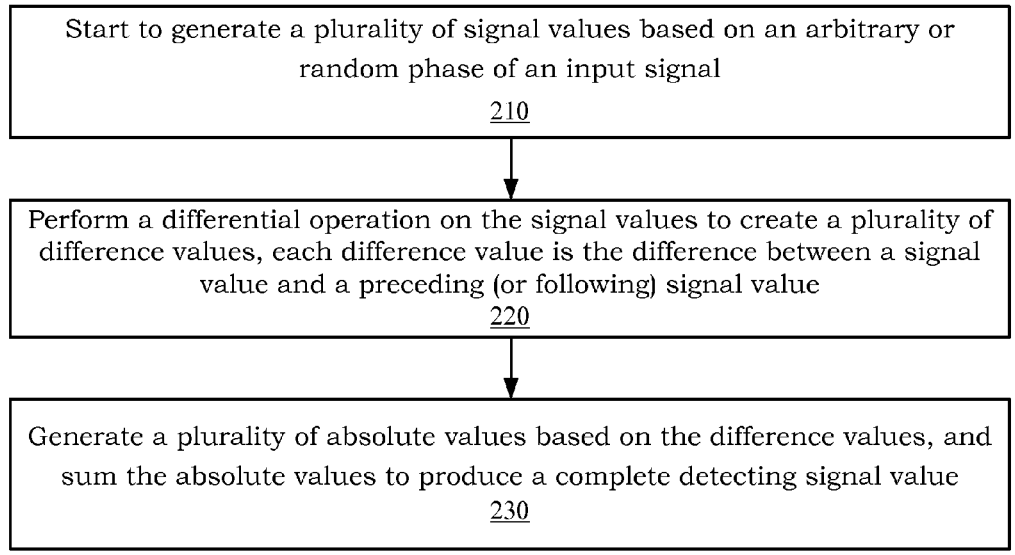
FIG. 2 is a flowchart illustrating a method for suppressing the interference of low-frequency noise in accordance with a first embodiment of the present invention.

In the following descriptions, a signal detected by a sensed conductive strip each time is referred to as a complete signal value. The present invention does not require an additional signal filtering circuit to reduce or eliminate the interference of low-frequency noise. Referring to FIG. 2, a flowchart illustrating a method for suppressing the interference of low-frequency noise in accordance with the present invention is shown.

Figure 3:
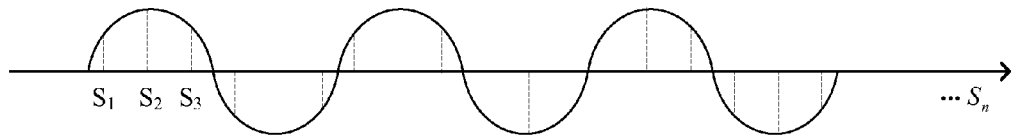
FIG. 3 is a schematic diagram illustrating sampling of signals in accordance with the first embodiment of the present invention.

First, as shown in step 210, a plurality of signal values is generated based on an arbitrary or random phase of an input signal. The signal values of the input signal can be first detected by a signal detecting circuit. For example, the input signal is passed through an integrator circuit for signal integration and then converted into digital signal values by an ADC (analog-to-digital converter). The signal detecting circuit may take multiple samples in one cycle to obtain a plurality of signal values. Each sample may generate one complete signal value through at least one integration, thus generating signal values, for example, $S_1, S_2, \ldots$, and $S_n$, respectively, wherein n is a natural number, as shown in FIG. 3. In other words, signal values can be generated without knowing the frequency of the input signal and/or the starting point of each cycle, that is, the input signal may start to generate the above signal values at any phase.

Next, in step 220, a differential operation is performed on the signal values to create a plurality of difference values. Each difference value is the difference between a signal value and a preceding (or following) signal value, thus creating difference values $D_1, D_2, \ldots$, and $D_{n-1}$, wherein $D_1=S_1-S_2$, $D_2=S_2-S_3, \ldots, D_{n-1}=S_{n-1}-S_n$. When the sampling interval of the signal values is very small, the amounts of interferences of the low-frequency noise experienced by two adjacent signal values will be similar to each other. By subtracting the two adjacent signal values from one another, the interferences of the low-frequency noise can be substantially canceled.

Then, in step 230, a plurality of absolute values is generated based on the difference values, and the absolute values are summed to produce a complete detecting signal value $S=\Sigma|D|=|D_0|+|D_1|+\ldots+|D_{n-1}|$.

Figure 4:
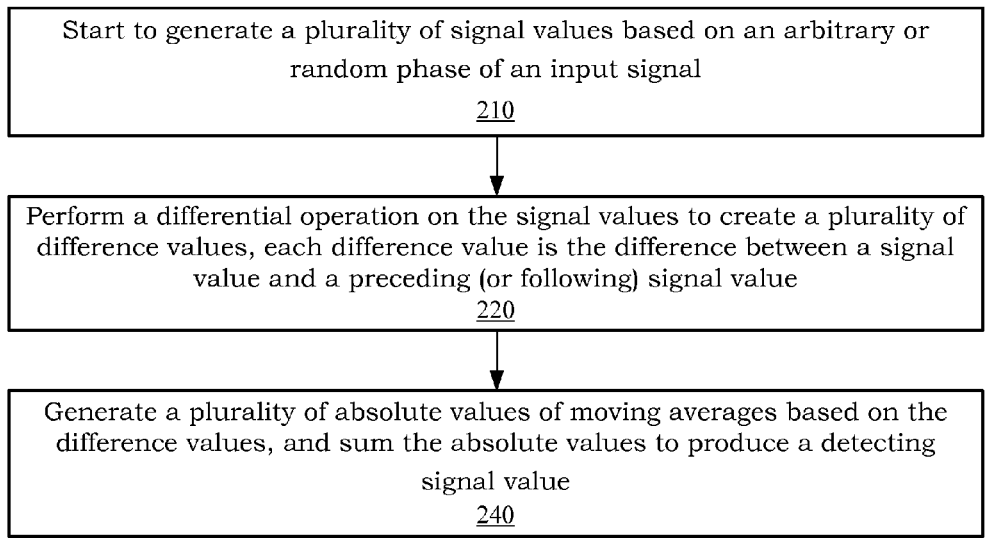
FIG. 4 is a flowchart illustrating a method for suppressing the interference of low-frequency noise in accordance with a second embodiment of the present invention.

In addition to suffering from the low-frequency noise, the input signal can also be affected by high-frequency noise interference. In order to address these two interferences at the same time, referring to FIG. 4, step 230 of FIG. 2 is replaced by step 240. In step 240, absolute values of a plurality of moving averages of the difference values are generated, and these absolute values are summed to produce a detecting signal value. The difference values produce moving averages $Z_1, Z_2, \ldots$, and $Z_{n-k+1}$, wherein k is a natural number greater than 1 and less than n, $$Z_n = \sum_{i=n}^{n+k-1} D_i,$$

and the complete detecting signal value $S=\Sigma|Z|=|Z_0|+|Z_1|+\ldots+|Z_n|$.

As such, in accordance with a first embodiment of the present invention, a detecting method for suppressing interference of low-frequency noise is proposed, which includes receiving an input signal; starting to generate a plurality of continuous signal values based on an arbitrary or random phase of the received input signal; generating a plurality of continuous difference values based on the signal values, wherein each difference value is the difference between two adjacent signal values; generating a plurality of continuous absolute values based on the difference values, wherein each absolute value is the absolute value of a difference value; and summing all of the absolute values to produce a complete detecting signal value. The signal values are $S_1, S_2, \ldots,$ and $S_n$, and the difference values are $D_1, D_2, \ldots,$ and $D_{n-1}$, wherein n is a natural number, and $D_1=S_1-S_2$, $D_2=S_2-S_3, \ldots, D_{n-1}=S_{n-1}-S_n$. Furthermore, the complete detecting signal value is $\Sigma|D|=|D_1|+|D_2|+ \ldots +|D_{n-1}|$.

Moreover, in accordance with a second embodiment of the present invention, in a best mode of the present invention, a detecting method for suppressing interference of low-frequency noise is proposed, which includes receiving an input signal; starting to generate a plurality of continuous signal values based on an arbitrary or random phase of the received input signal; generating a plurality of continuous difference values based on the signal values, wherein each difference value is the difference between two adjacent signal values; generating a plurality of continuous moving averages based on the difference values, wherein each moving average is an average of a distinct set of continuous difference values, and the sets of continuous difference values on which two adjacent moving averages are respectively based differ by at least one difference value; generating a plurality of continuous absolute values based on the moving averages, wherein each absolute value is the absolute value of a moving average; and summing all of the absolute values to produce a complete detecting signal value. The signal values are $S_1, S_2, \ldots,$ and $S_n$, and the difference values are $D_1, D_2, \ldots,$ and $D_{n-1}$, wherein n is a natural number, and $D_1=S_1-S_2$, $D_2=S_2-S_3, \ldots, D_{n-1}=S_{n-1}-S_n$. Furthermore, the moving averages are $Z_1, Z_2, \ldots,$ and $Z_{n-k+1}$, and $$Z_n = \sum_{i=n}^{n+k-1} D_i,$$

wherein k is a natural number greater than 1 and less than n, and the complete detecting signal value is $\Sigma|Z|=|Z_1|+|Z_2|+ \ldots +|Z_{n-k+1}|$.

In an example of the present invention, the first one of the signal values is generated at any arbitrary or random phase of the input signal, and any two adjacent signal values are generated at a fixed phase interval. In other words, the generation of the signal values does not have to be synchronized with the received input signal. For example, the signal values are generated based on a working frequency which does not have to be synchronized to the input signal. In another example of the present invention, signal values are generated at a plurality of predetermines phases in each cycle of the input signal.

In an example of the present invention, the input signal is received by one of a plurality of sensed conductive strips of a touch sensor, and a complete signal value created when the touch sensor is not touched or approached is used as a reference. As such, the present invention further includes generating a difference between a complete signal value and a reference as the amount of change in the complete signal value to further determine if there is a touch or approach of an external conductive object, or to determine the location of an external conductive object.

Figure 5:
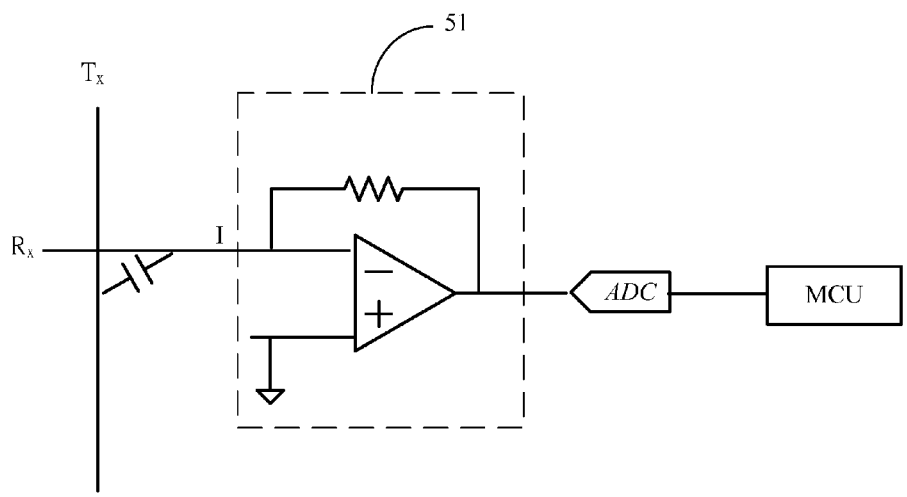
FIG. 5 is a schematic circuit diagram illustrating a detecting device for suppressing the interference of low-frequency noise in accordance with a first embodiment of the present invention.

Referring to FIG. 5, a detecting device for suppressing interference of low-frequency noise proposed in accordance with a third embodiment of the present invention is shown, which includes: a receiving circuit 51, an ADC, and a controller (MCU). In accordance with the above step 210, the receiving circuit 51 is used for receiving an input signal, and the ADC starts to generate a plurality of continuous signal values at an arbitrary or random phase of the received input signal. In addition, in accordance with the above steps 220 and 230, the MCH includes: a means for generating a plurality of continuous difference values based on the signal values, a means for generating a plurality of continuous absolute values based on the difference values, and a means for summing the absolute values to produce a complete detecting signal value.

FIG. 5 can be a detecting device for suppressing interference of low-frequency noise proposed in accordance with a fourth embodiment of the present invention is shown, which includes: a receiving circuit 51, an ADC, and a controller (MCU). In accordance with the above step 210, the receiving circuit 51 is used for receiving an input signal, and the ADC starts to generate a plurality of continuous signal values at an arbitrary or random phase of the received input signal. In addition, in accordance with the above steps 220 and 240, the MCH includes: a means for generating a plurality of continuous difference values based on the signal values, a means for generating a plurality of continuous moving averages based on the difference values, a means for generating a plurality of continuous absolute values based on the moving averages, and a means for summing the absolute values to produce a complete detecting signal value.

The receiving circuit 51 in FIG. 5 is merely an example of the present invention, one with ordinary skill in the art can readily appreciate other implementations of the receiving circuit, and the present invention is not limited as such.

In an example of the present invention, the input signal is provided by the controller to one or a set of driven conductive strips of the touch sensor. The receiving circuit receives the input signal by a sensed conductive strip, wherein the sensed conductive strip is capacitively coupled with the one or the set of driven conductive strips being provided with the input signal.

Figure 6:
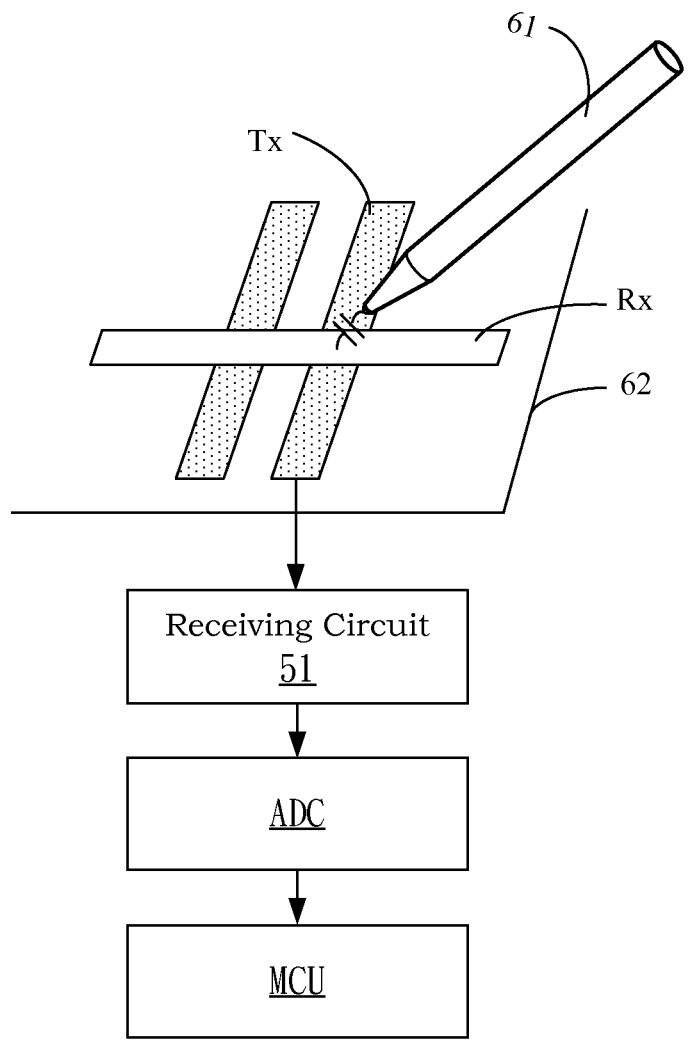
FIG. 6 is a functional block diagram illustrating a detecting device for suppressing the interference of low-frequency noise in accordance with the present invention.

Referring to FIG. 6, in an example of the present invention, the above input signal is generated by an active capacitive pen 61. The input signal is received by the above receiving circuit through the capacitive coupling between a vertical conductive strip Tx and a horizontal conductive strip Rx of a touch sensor 62. The MCU may simply generate the above signal values without being synchronized to the input signal.

Figure 7:
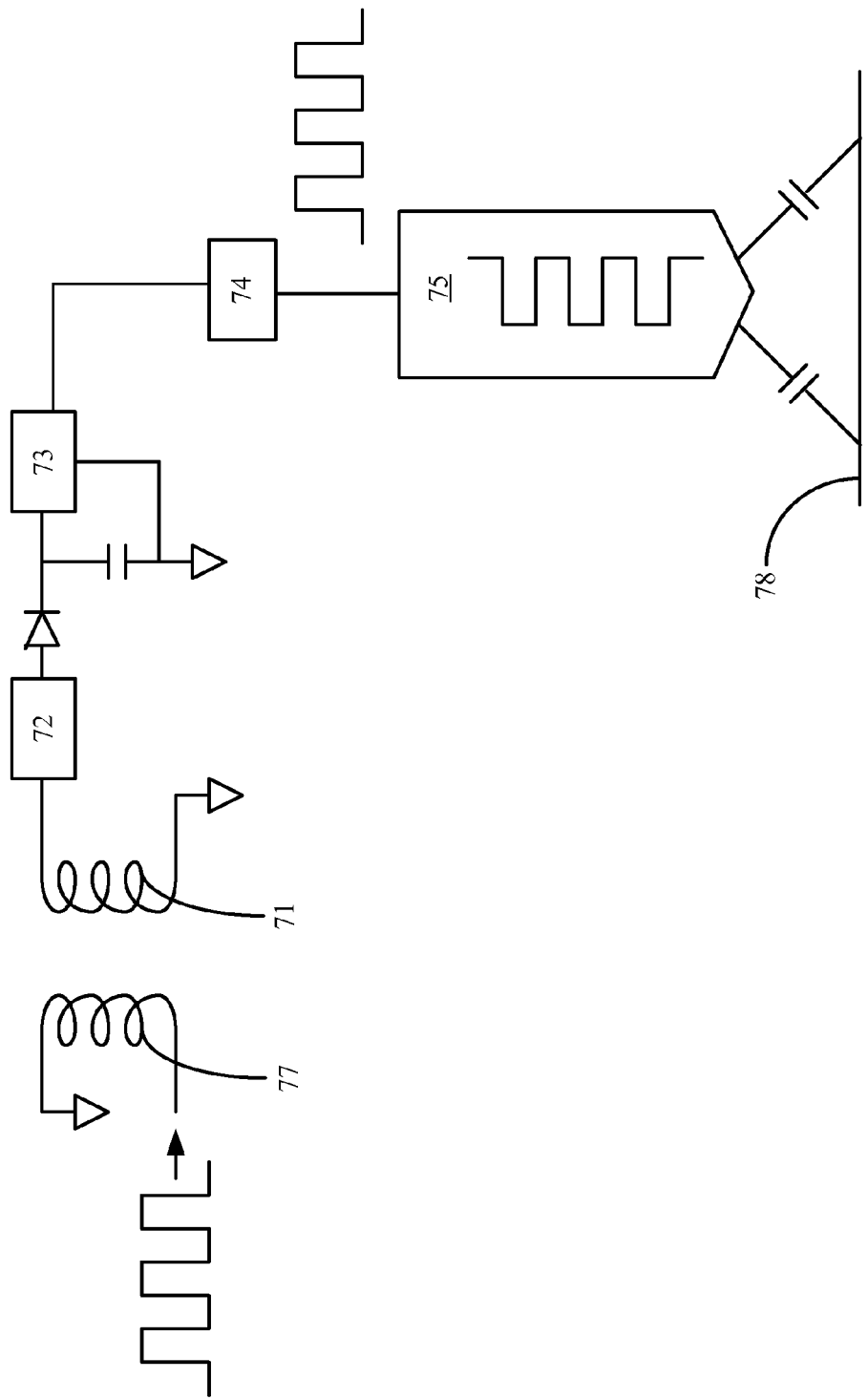
FIG. 7 is a functional block diagram illustrating an active capacitive pen in accordance with the present invention.

Referring now to FIG. 7, a block diagram depicting functionalities of an active capacitive pen is shown. The active capacitive pen includes an internal coil 71, a rectifier 72, a DC converter 73, an AC signal generator 74 and a signal transmitting end 75.

The internal coil 71 can obtain an input signal through electromagnetic induction via an external coil 77, which serves as the power supply for the active capacitive pen. The input signal may be provided via the rectifier 72 (e.g. a bridge rectifier) to the DC converter 73 (e.g. a low dropout regulator) for providing a DC signal. The AC signal generator 74 (e.g. a "555 calculator") provides an AC signal by using the DC signal as the power supply, and the AC signal is sent out through the signal transmitting end 75. In an example of the present invention, a voltage booster (such as a level shifter) can be added between the AC signal generator 74 and the signal transmitting end 75 to increase the electric potential of the AC signal.

In an example of the present invention, the external coil 77 can be provided in a capacitive touch sensor as described before. The external coil 77 may be provided in proximity to or around the electrodes. Alternatively, one or more electrodes act as the external coil 77. The present invention does not limit the form of the external coil 77. The external coil 77 can provide a signal for electromagnetic induction with the internal coil 71 by a controller. The controller can also include the detecting circuit as described before. In other words, the active capacitive pen 7 obtains external power through electromagnetic induction as the source of power for its internal circuits. One with ordinary skill in the art can appreciate that the active capacitive pen can also include a battery or a capacitor, wherein external power is obtained through electromagnetic induction to charge the battery or the capacitor, and as the source of power for its internal circuits.

Thus, when the active capacitive pen 7 approaches or touches the capacitive touch sensor, power is obtained from the external coil 77, and an AC signal is sent from the signal transmitting end 75. In an example of the present invention, the external coil 77 may continuously provide power. In another example of the present invention, the external coil 77 may intermittently provide power. For example, power is provided during detection of a hand, while power is not provided during detection of a pen. Once the active capacitive pen 7 obtains power, it immediately sends out the AC signal. Since the change in signals injected by an active capacitive pen to the electrodes is opposite to the change in signals by a hand touching or approaching the electrodes, the pen will be not mistakenly determined as a touch or an approach of a hand. In an example of the present invention, if an approaching pen is detected during the detection of a hand, the hand is ignored, i.e. the coordinates of the location of the hand are not provided. During the detection of a pen, although the external coil 77 is not providing any power, the active capacitive pen 7 may still have some remaining power, and is still able to send out AC signals for a short time for capacitive coupling with the capacitive touch sensor 78, and thus injecting the input signals. Accordingly, the detecting circuit will be able to determine the location of the active capacitive pen 7.

The above provision of the location of a hand may include the provision of a plurality of locations approached or touched by hand(s). In addition, the detecting circuit may detect the AC signal (the input signal) sent by the active capacitive pen 7 according to the first or the second embodiment. Without the need for an internal power supply (e.g. a battery), the active capacitive pen 7 of the present invention can be made very thin and light, and no complicated circuit is required for synchronization with the detecting circuit. The present invention thus has the advantages of a simple structure and high applicability.

Moreover, the active capacitive pen may further include a tilt switch for detecting the degree of tilt of the active capacitive pen and turning on/off the power of the active capacitive pen based on the degree of tilt. For example, when the active capacitive pen is placed flat or close to horizontal, for example, at an angle of less than 30 degrees with the horizontal line, the power of the active capacitive pen is turned off. The power is provided by an internal battery of the active capacitive pen, for example, so when the active capacitive pen is placed flat or closed to horizontal, it will stop emitting any AC signal, or alternatively, the entire active capacitive pen is powered off to preserve power. The switch may include mercury, which is stored in a chamber within the pen. The two opposite ends of the chamber have the electrodes of the switch, respectively. When the active capacitive pen is placed flat or closed to horizontal, mercury inhibit conduction of the two electrodes, but when the active capacitive pen is tilted over a certain angle, mercury will conduct the two electrodes, allowing the active capacitive pen to emit AC signals, or allowing the entire active capacitive pen to be turned on. In addition, when power is coming from the outside, the above tilt switch can be used to stop the active capacitive pen from sending out the AC signals. Moreover, the above tilt switch can be a gravity sensor.

Furthermore, the above controller may include a counter, a counting circuit, or a program for counting how long a capacitive pen has left or moved away from the capacitive touch sensor. When the capacitive pen has not yet left or moved away from the capacitive touch sensor, or when the time the capacitive pen has not yet left or moved away from the capacitive touch sensor is less than a threshold, hand detection is stopped until the capacitive pen has left or moved away from the capacitive touch sensor for a period of time longer than the threshold.

This is done because, when writing on a capacitive touch sensor using a pen, the pen may temporarily leave the capacitive touch sensor, and during this time, a hand touching the capacitive touch sensor may be mistakenly regarded as a touching pen, causing confusion in the writing track of the pen. Thus, it is proposed that within a predetermined period of time since the pen moved away from the capacitive touch sensor (when the absence of the pen is less than the threshold), hand detection is not performed in order to avoid this problem The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A detecting method for suppressing interference of low-frequency noise, comprising:
receiving an input signal;
starting to generate a plurality of continuous signal values based on an arbitrary or random phase of the received input signal;
generating a plurality of continuous difference values based on the signal values, wherein each difference value is the difference between two adjacent signal values;
generating a plurality of continuous absolute values based on the difference values, wherein each absolute value is the absolute value of a difference value; and
summing all of the absolute values to produce a complete detecting signal value.

2. The detecting method of claim 1, wherein any two adjacent signal values are generated at a fixed phase interval.

3. The detecting method of claim 1, wherein the signal values are generated at a plurality of predetermined phases in each cycle of the input signal.

4. The detecting method of claim 1, wherein the signal values are $S_1, S_2, \ldots,$ and $S_n$, and the difference values are $D_1, D_2, \ldots,$ and $D_{n-1}$, wherein n is a natural number, and $D_1=S_1-S_2, D_2=S_2-S_3, \ldots, D_{n-1}=S_{n-1}-S_n$.

5. The detecting method of claim 1, wherein the input signal is received by one of a plurality of sensed conductive strips of a touch sensor, and a complete signal value generated when the touch sensor is not touched or approached is used as a reference.

6. The detecting method of claim 5, further comprising:
generating a difference between the complete signal value and the reference as an amount of change in the complete signal value.

7. A detecting method for suppressing interference of low-frequency noise, comprising:
- receiving an input signal;
- starting to generate a plurality of continuous signal values based on an arbitrary or random phase of the received input signal;
- generating a plurality of continuous difference values based on the signal values, wherein each difference value is the difference between two adjacent signal values;
- generating a plurality of continuous moving averages based on the difference values, wherein each moving average is an average of a distinct set of continuous difference values, and the sets of continuous difference values on which two adjacent moving averages are respectively based differ by at least one difference value;
- generating a plurality of continuous absolute values based on the moving averages, wherein each absolute value is the absolute value of a moving average; and
- summing all of the absolute values to produce a complete detecting signal value.

8. The detecting method of claim 7, wherein any two adjacent signal values are generated at a fixed phase interval.

9. The detecting method of claim 7, wherein the signal values are generated at a plurality of predetermined phases in each cycle of the input signal.

10. The detecting method of claim 7, wherein the signal values are $S_1, S_2, \ldots,$ and $S_n$, and the difference values are $D_1, D_2, \ldots,$ and $D_{n-1}$, wherein n is a natural number, and $D_1=S_1-S_2, D_2=S_2-S_3, \ldots, D_{n-1}=S_{n-1}-S_n$.

11. The detecting method of claim 10, wherein the moving averages are $Z_1, Z_2, \ldots,$ and $Z_{n-k+1}$, and $$Z_n = \sum_{i=n}^{n+k-1} D_i,$$

wherein k is a natural number greater than 1 and less than n, and the complete detecting signal value is $\Sigma|Z|=|Z_1|+|Z_2|+\ldots+|Z_{n-k+1}|$.

12. The detecting method of claim 7, wherein the input signal is received by one of a plurality of sensed conductive strips of a touch sensor, and a complete signal value generated when the touch sensor is not touched or approached is used as a reference.

13. The detecting method of claim 12, further comprising: generating a difference between the complete signal value and the reference as an amount of change in the complete signal value.

14. A detecting device for suppressing interference of low-frequency noise, comprising:
- a receiving circuit for receiving an input signal;
- an analog-to-digital converter for starting to generate a plurality of continuous signal values based on an arbitrary or random phase of the received input signal; and
- a controller including:
  - a means for generating a plurality of continuous difference values based on the signal values, wherein each difference value is the difference between two adjacent signal values;
  - a means for generating a plurality of continuous moving averages based on the difference values, wherein each moving average is an average of a distinct set of continuous difference values, and the sets of continuous difference values on which two adjacent moving averages are respectively based differ by at least one difference value;
  - a means for generating a plurality of continuous absolute values based on the moving averages, wherein each absolute value is the absolute value of a moving average; and
  - a means for summing all of the absolute values to produce a complete detecting signal value.

15. The detecting device of claim 14, wherein the first one of the signal values is generated at an arbitrary phase of the input signal, and any two adjacent signal values are generated at a fixed phase interval.

16. The detecting device of claim 14, wherein the signal values are generated at a plurality of predetermined phases in each cycle of the input signal.

17. The detecting device of claim 14, wherein the input signal is provided by an active capacitive pen, the input signal provided by the capacitive pen is capacitively coupled with a conductive strip of a touch sensor and is received by the receiving circuit through a conductive strip.

18. A detecting device for suppressing interference of low-frequency noise, comprising:
- a receiving circuit for receiving an input signal;
- an analog-to-digital converter for starting to generate a plurality of continuous signal values based on an arbitrary or random phase of the received input signal; and
- a controller including:
  - a means for generating a plurality of continuous difference values based on the signal values, wherein each difference value is the difference between two adjacent signal values;
  - a means for generating a plurality of continuous absolute values based on the difference values, wherein each absolute value is the absolute value of a difference value; and
  - a means for summing the absolute values to produce a complete detecting signal value.

19. The detecting device of claim 18, wherein the first one of the signal values is generated at an arbitrary phase of the input signal, and any two adjacent signal values are generated at a fixed phase interval.

20. The detecting device of claim 18, wherein the signal values are generated at a plurality of predetermined phases in each cycle of the input signal.

21. The detecting device of claim 18, wherein the input signal is provided by an active capacitive pen, the input signal provided by the capacitive pen is capacitively coupled with a conductive strip of a touch sensor and is received by the receiving circuit through a conductive strip.

* * * * *